United States Patent
Rathfelder et al.

(10) Patent No.: US 6,953,974 B2
(45) Date of Patent: Oct. 11, 2005

(54) EEPROM DEVICE AND METHOD FOR PROVIDING LOWER PROGRAMMING VOLTAGE

(75) Inventors: Peter A. Rathfelder, Tucson, AZ (US); Francisco De La Moneda, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 133 days.

(21) Appl. No.: 10/647,965

(22) Filed: Aug. 26, 2003

(65) Prior Publication Data

US 2005/0047211 A1 Mar. 3, 2005

(51) Int. Cl.$^7$ ............................................. H01L 31/062
(52) U.S. Cl. ........................................ 257/381; 257/385
(58) Field of Search ............................... 257/385, 392, 257/381; 438/263; 365/165.28

(56) References Cited

U.S. PATENT DOCUMENTS 5,668,754 A * 9/1997 Yamashita .................. 365/145

\* cited by examiner

*Primary Examiner*—David Nelms
*Assistant Examiner*—Thinh T Nguyen
(74) *Attorney, Agent, or Firm*—W. Daniel Swayze, Jr.; W. James Brady; Frederick J. Telecky, Jr.

(57) ABSTRACT

An improved EEPROM device and method for providing a lower device programming voltage is disclosed. An exemplary EEPROM device is configured with a modified drawing layer comprising one or more serrated elements configured underneath a tunneling region of the EEPROM device. The serrated elements can comprise regions having at least one acute angle structure within the active mask drawing layer configured to provide a restriction of the oxygen used to grow the gate oxide that determines the programming voltage of the EEPROM device. In addition the serrated elements can also be configured with at least two acute angle thin oxide regions configured in a staggered arrangement to allow for misalignment between the active layer and the polysilicon layer such that at least one acute angle thin oxide region is found in the tunneling region underneath the polysilicon layer of the tunneling region. As a result of a thinner gate oxide region being formed, a lower programming voltage is needed by the EEPROM device.

33 Claims, 3 Drawing Sheets

EEPROM DEVICE AND METHOD FOR PROVIDING LOWER PROGRAMMING VOLTAGE

TECHNICAL FIELD

The present invention relates, generally, to semiconductor devices. More particularly, the present invention relates to an EEPROM device and method for providing a lower device programming voltage.

BACKGROUND OF THE INVENTION

In an effort to optimize and create improved analog devices, attention has been made to the improving of trimming procedures and techniques. In modern trimming techniques, a standardized semiconductor industry device known as an Electrically Erasable Programmable Ready Only Memory (EEPROM) device is often utilized. Such EEPROM devices can be configured in various manners, such as in single or double polysilicon structures, single or double bit structures, and/or distributive-gate arrangements.

Since the ultra-thin oxides used for electron tunneling into the first polysilicon layer of double polysilicon layered EEPROM devices generally cannot be grown on the N+ regions of the device with typical technologies and processes, single polysilicon structures (single poly) in EEPROM devices are often utilized. In addition, many EEPROM devices utilize a distributive-gate configuration that can generally be manufactured through standard CMOS semiconductor processes without expensive process modifications. Non-distributive or other standard EEPROM devices require expensive process step changes and modifications during manufacturing.

With reference to FIGS. 1A and 1B, representative diagrams a of a top view and a cross-sectional view of a conventional single-poly, distributive EEPROM device 100 are illustrated. The continuous single-poly configuration of EEPROM cell 100 is configured to provide three devices. In the center of EEPROM device 100, an NMOS device comprises a READ transistor 104. The right side of EEPROM device 100 comprises a capacitor 102 having a fork-shaped poly structure with an underlying SNWELL providing a control gate 108 configured to provide a WRITE (W) input. The left side of EEPROM device 100 includes a tunneling region 106 configured to provide an ERASE (E) input. The magnitude of the voltage for the programming WRITE (W) and ERASE (E) pulses can be critical to operation of EEPROM cell 100 during calibration of an analog circuit.

The programming voltage of distributive EEPROM device 100 is determined by the thickness of the gate oxide underneath tunneling region 106 of EEPROM device 100. For standard CMOS processes, this oxide thickness is the same as that of the oxide used by the control logic CMOS transistors of the analog integrated circuit device to be trimmed or calibrated. Because the oxide used for programming voltages is the same oxide used on the control CMOS transistors, the programming voltage is developed by importing a high voltage power source from outside the analog integrated circuit, such as a 12V input supply for a conventional 5V CMOS analog circuit. As a result, an analog circuit using an EEPROM device for calibration can only be calibrated or trimmed typically during probe or final test operation at the manufacturer's location, as opposed to after packaging and/or after customer printed circuit board mounting.

In addition, current precision analog integrated circuits have become very susceptible to physical stress mis-calibration, such as that occurring after final testing at the manufacturer's location. For example, since silicon is a piezoelectric material, any strain placed on the silicon, whether from the plastic packaging or from mounting the integrated circuit to the printed circuit board, often results in mis-calibration. Accordingly, a need has arisen to provide for a mechanism and technique to provide for re-programming of the precision analog integrated circuit device after packaging and/or after customer printed circuit board mounting. Such internal re-programming must be accomplished through the on-chip transistors and on-chip power supplies. However, standard distributive EEPROM devices generally require approximately 10 volts for programming of a 5V CMOS analog circuit, making such EEPROM devices unsuitable for programming by on-chip devices.

SUMMARY OF THE INVENTION

In accordance with various aspects of the present invention, an EEPROM device and method for providing a lower device programming voltage is disclosed. In accordance with an exemplary embodiment, an exemplary EEPROM device is configured with a modified drawing layer to provide a lower programming voltage. The exemplary modified drawing layer within the EEPROM device can comprise one or more serrated elements configured underneath a tunneling region of the EEPROM device.

In accordance with an exemplary embodiment, the one or more serrated elements can comprise regions having at least one acute angle structure within the active mask drawing layer underneath the tunneling region of the EEPROM device. The acute angled structures are configured to provide a restriction of the oxygen used to grow the gate oxide that determines the programming voltage of the EEPROM device. In addition to acute angle structures, the one or more serrated elements can also be configured in other configurations, such as rectangular, pentagonal, hexagonal, or other multiple-sided regions, or semi-circular regions and the like having narrowed portions configured for restriction of oxide growth. As a result of a thinner gate oxide region being formed, a lower programming voltage is needed by the EEPROM device.

In accordance with an exemplary embodiment, a serrated element can also comprise a staggered configuration that allows for misalignment between an active layer and a polysilicon layer. For example, a modified drawing layer can comprise at least two serrated elements comprising an acute angle thin oxide region configured underneath the tunneling region of the EEPROM device. The acute angle thin oxide regions are suitably drawn in the active layer and staggered in the vertical axis such that as layer misalignment occurs between the active layer and the polysilicon layer, at least one acute angle thin oxide region remains underneath the tunneling region of the polysilicon layer.

In accordance with an exemplary embodiment, an exemplary method for providing a lower programming voltage in an EEPROM device comprises the steps of modifying a mask drawing layer with one or more serrated elements configured underneath a tunneling region of the EEPROM device, and restricting oxygen proximate to the one or more serrated elements when forming a gate oxide region underneath the tunneling region.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE PRESENT INVENTION

The present invention may be described herein in terms of various functional components. It should be appreciated that such functional components may be realized by any number of hardware or structural devices configured to perform the specified functions. For example, the present invention may employ various integrated components, e.g., buffers, supply references, current sources, signal conditioning devices and the like, comprised of various electrical devices, e.g., resistors, transistors, capacitors, diodes and other components whose values may be suitably configured for various intended purposes. In addition, the present invention may be practiced in any integrated circuit application where a restriction of growth of gate oxide can be utilized. However, for purposes of illustration only, exemplary embodiments of the present invention are described herein in connection with an EEPROM device application, such as for calibration or operation within an analog circuit. Further, it should be noted that while various components may be suitably coupled or connected to other components within exemplary circuits, such connections and couplings can be realized by direct connection between components, or by connection or coupling through other components and devices located thereinbetween.

Figure 2:
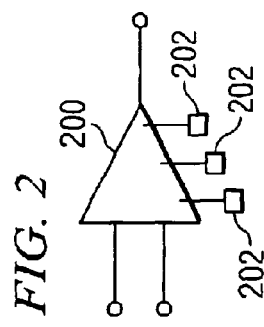
FIG. 2 illustrates an exemplary analog integrated circuit having an exemplary EEPROM device in accordance with an exemplary embodiment of the present invention.

In accordance with various aspects of the present invention, an EEPROM device and method for providing a lower device programming voltage is disclosed. The exemplary EEPROM device and method can be configured within any analog integrated circuit application. For example, with reference to an exemplary embodiment illustrated in FIG. 2, one or more exemplary EEPROM devices 202 can be configured to facilitate trimming or calibration of an analog device or component 200, such as an amplifier circuit or any other type of analog circuit or device. In addition to trimming or calibration of an analog device or component 200, exemplary EEPROM devices 202 can be configured in any other arrangement wherein lower programming voltages are desired.

Figure 1A:
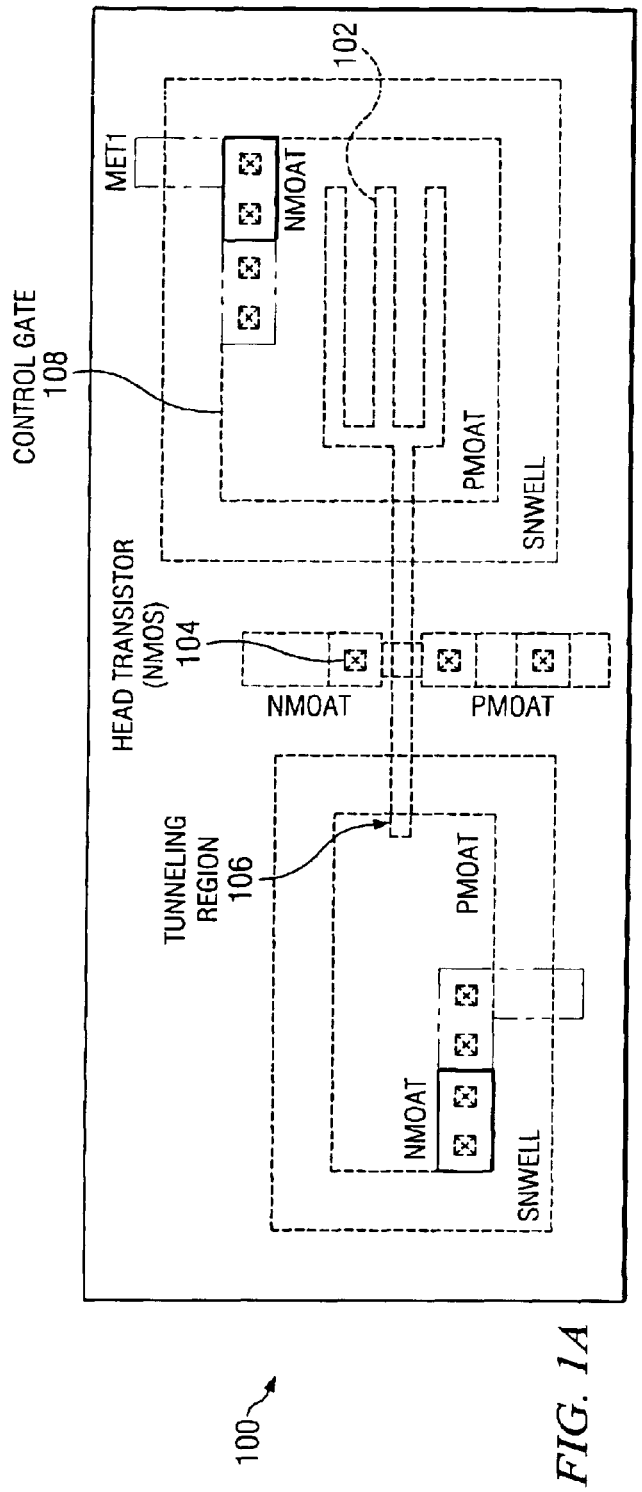
FIG. 1A illustrates a representative diagram of a top view of a conventional single-polysilicon, distributive EEPROM device.
Figure 1B:
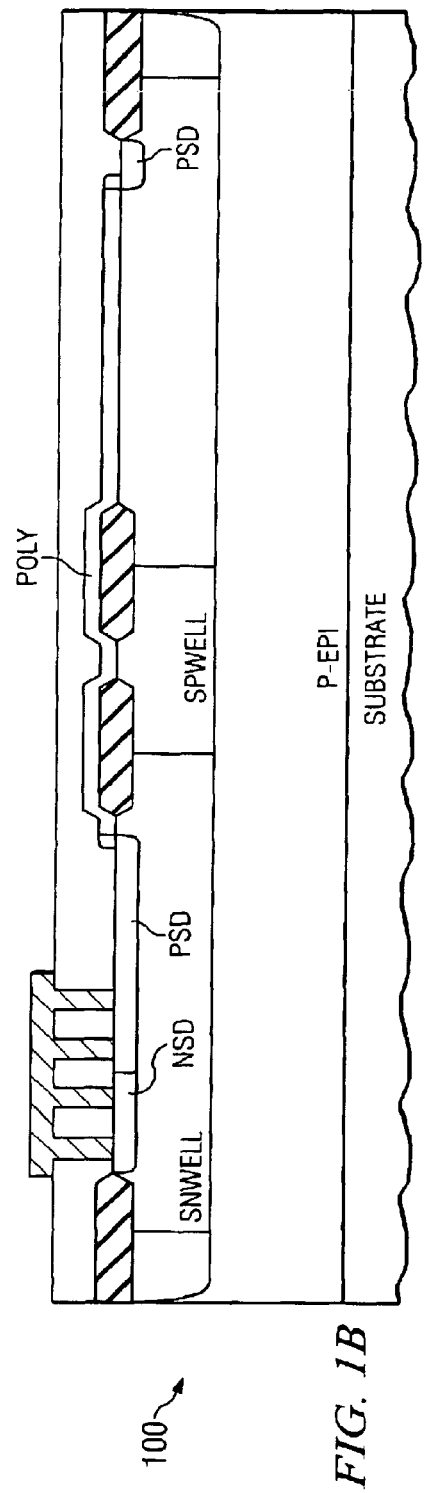
FIG. 1B illustrates a cross-sectional view of the conventional single-polysilicon, distributive EEPROM device illustrated in FIG. 1A.

An exemplary EEPROM device 202 having a lower programming voltage can comprise various configurations within an analog circuit. For example, an exemplary EEPROM device can comprise a single-bit device having a single programming capacitor, a single control gate and a single tunneling region, such as that illustrated in FIG. 1, in a distributed-gate or non-distributed-gate arrangement.

Figure 3:
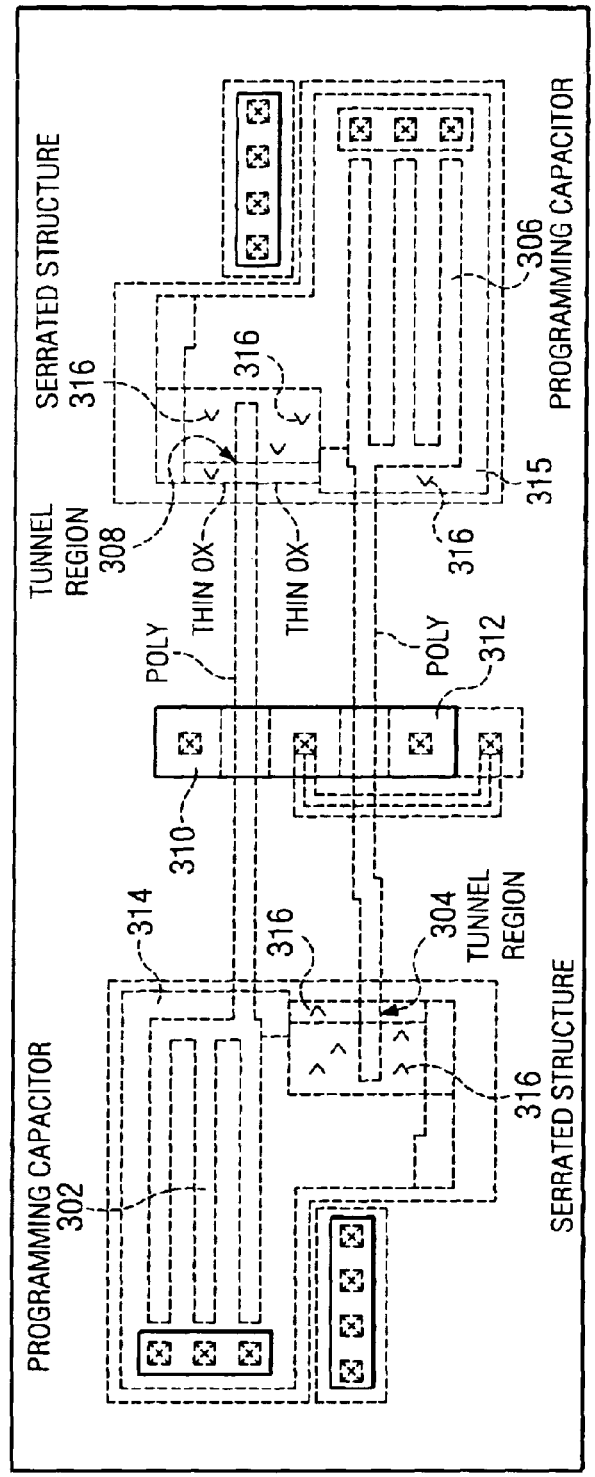
FIG. 3 illustrates a representative diagram of a top view of an exemplary EEPROM device in accordance with an exemplary embodiment of the present invention.

In addition, an exemplary EEPROM device can also be configured in a double-bit arrangement, or any other multiple-bit configuration. For example, with reference to FIG. 3, an exemplary double-bit EEPROM device 300 having various components including a first programming capacitor 302 and a first tunneling region 304, and a second programming capacitor 306 and a second tunneling region 308. EEPROM device 300 further comprises a first and second READ transistor 310 and 312, and first and second control gates 314 and 315. Such components can be configured in various other manners and sizes and are not limited to that illustrated in FIG. 3.

In this exemplary embodiment, EEPROM device 300 is configured in a distributed-gate arrangement. Distributive-gate configured EEPROM devices can be manufactured through standard CMOS semiconductor processes without expensive process modifications; however, an exemplary EEPROM device is not limited to a distributed-gate configuration, and can include any non distributed-gate configurations as well.

To provide a lower programming voltage, EEPROM device 300 is configured with a modified drawing layer. In accordance with an exemplary embodiment, EEPROM device 300 includes a modified drawing layer comprising one or more serrated elements 316 configured underneath a tunneling region, such as tunneling region 304 and/or 308 of EEPROM device 300. Each of one or more serrated elements 316 comprise thin oxide serrations or regions and are configured to provide a restriction of the oxygen used to grow the gate oxide that determines the programming voltage of EEPROM device 300. As a result of a thinner gate oxide region being formed, a lower programming voltage is required by the EEPROM device 300.

Serrated elements 316 can be configured in various manners for providing a thin oxide region within EEPROM device 300. In accordance with an exemplary embodiment, any or all of serrated elements 316 can comprise thin oxide serrations or regions having at least one acute angle structure within the active mask drawing layer underneath tunneling regions 304 and/or 308 of EEPROM device 300. The active mask semiconductor process is configured to grow thick oxide used for isolation between transistors, and to prepare the silicon for gate oxide growth. Providing an acute angle structure within the active mask drawing layer suitably reduces the oxide growth underneath a tunneling region, such as in tunneling regions 304 and/or 308.

Figure 4:
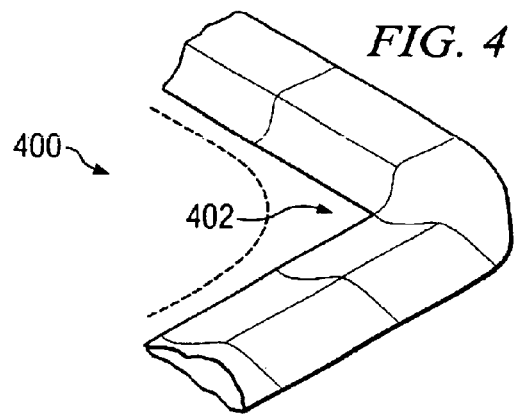
FIG. 4 illustrates a perspective view of an exemplary serrated element in accordance with an exemplary embodiment of the present invention.

For example, with additional reference to FIG. 4, serrated element 316 can comprise an acute angled structure 400. Acute angled structure 400 is configured to provide a restriction of the oxygen used to grow the gate oxide that determines the programming voltage of EEPROM device 300. Acute angle structure 400 is suitably configured to provide a reduced thickness gate oxide proximate to a narrower acute angle region 402. During semiconductor processing, a thinner gate oxide region is formed within acute angle structure 400 because oxygen has difficulty penetrating narrower acute angle region 402, i.e., acute angle structure 400 provides restrictions to oxygen in a narrower acute angle region 402 when drawing corners under polysilicon during the semiconductor manufacturing process.

Acute angle structure 400 can be configured in various manners to provide a reduced thickness gate oxide, with various angles and geometries for acute angle region 402. For example, acute angle structure 400 can comprise an acute angle region 402 having an acute angle of approximately 90 degrees. However, acute angle structure 400 can also be configured with an acute angle region 402 having other acute angles, such as approximately 45 degrees or 135 degrees, or any other angle greater than zero and less than 180 degrees. In other words, acute angle structure 400 can comprise any acute angle region 402 configured to restrict oxygen and thus make the growing of oxide difficult, resulting in a thinner oxide region.

While an exemplary serrated element 316 can comprise a thin oxide serration or region having at least one acute angle structure, serrated element 316 can comprise other configurations in addition to acute angle arrangements. For example, a serrated element 316 can comprise a rectangular, pentagonal, hexagonal, or other multiple-sided regions, or semi-circular regions. In each embodiment, serrated element 316 includes a wider, i.e., more opened, portion reducing to a narrower, i.e., more closed, portion for providing restricted oxide growth. Accordingly, in addition to acute angle structure 400, an exemplary serrated element 316 can comprise any other region configured to provide a restriction to oxygen used for oxide growth, thus resulting in a thinned-oxide region within the mask drawing layer underneath the tunneling region of EEPROM device 300.

An exemplary serrated element 316 can also be configured in various orientations within an exemplary EEPROM device 300. For example, serrated element 316 can be configured to provide the more opened and narrowed sections facing towards, i.e., opening towards, various directions underneath tunneling regions 304 and/or 308, such as the vertical axis, horizontal axis, or in between. In addition, with multiple serrated elements 316 configured within an EEPROM device 300, any one or more serrated elements 316 can be suitably oriented in different positions than any other serrated elements 316, i.e., a first serrated element 316 does not have to be oriented or positioned in the same manner as any or all other serrated elements 316.

Figure 5:
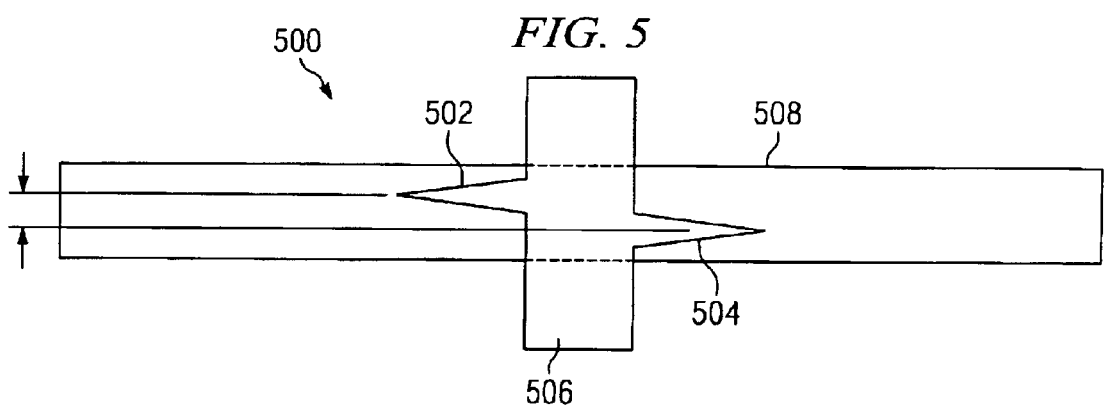
FIG. 5 illustrates a top view of an exemplary serrated element configuration in accordance with an exemplary embodiment of the present invention.

In accordance with an exemplary embodiment, a serrated element 316 is configured in a staggering configuration to address misalignment between an active layer and a polysilicon layer. For example, a modified drawing layer can comprise two serrated elements 316 having acute angle thin oxide regions configured underneath a tunneling region of EEPROM device 300 in a staggering arrangement. With reference to FIG. 5, an exemplary EEPROM device can comprise a serrated element configuration comprising at least two acute angle thin oxide regions 502 and 504 suitably drawn in an active layer 506 and staggered in the vertical axis such that as layer misalignment occurs between active layer 506 and a polysilicon layer 508, at least one of acute angle thin oxide regions 502 and 504 is found underneath the tunneling region of polysilicon layer 508.

The amount of stagger between acute angle thin oxide regions 502 and 504 can comprise varying amounts suitably configured to allow for misalignment between active layer 506 and a polysilicon layer 508. Such a staggering configuration can also suitably comprise more than two acute angle thin oxide regions to address misalignment between active layer 506 and polysilicon layer 508. In addition, an exemplary staggering configuration can also comprise other arrangements in addition to acute angle structures, such as rectangular, pentagonal, hexagonal, or other multiple-sided regions, or semi-circular regions or any other like structures having an narrowed portion and configured for allowing for misalignment between active layer 506 and polysilicon layer 508.

Figure 6:
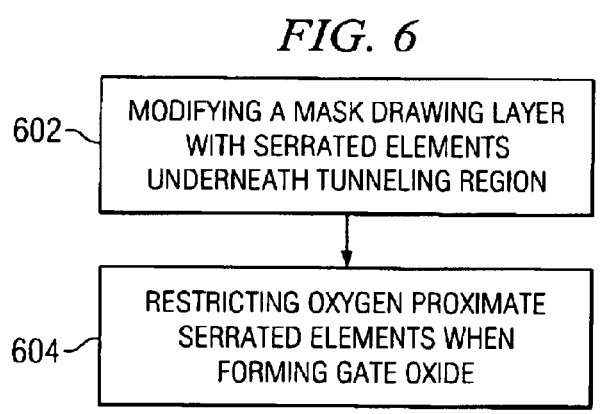
FIG. 6 illustrates a flow chart of an exemplary method for providing a lower programming voltage in an EEPROM device in accordance with an exemplary embodiment of the present invention.

Accordingly, an exemplary EEPROM device can be provided with only minor changes to the mask drawing layer and without significant process modifications. In accordance with an exemplary embodiment, with reference to FIG. 6, an exemplary method 600 for providing a lower programming voltage in an EEPROM device comprises a first step 602 of modifying a mask drawing layer with one or more serrated elements configured underneath a tunneling region of the EEPROM device. The mask drawing layer suitably comprises an area proximate to the active mask region used to grow thicker oxide used for isolation between transistors. In accordance with an exemplary embodiment, any of the one or more serrated elements can comprise at least one acute angle structure, or any other rectangular, pentagonal, hexagonal, or other multiple-sided structure, semi-circular structures or any other like structures configured for restricting oxide growth and configured underneath the tunneling region of the EEPROM device. In addition, the EEPROM device can be configured with multiple serrated elements configured in a staggered arrangement to allow for misalignment between the active layer and the polysilicon layer.

In a second step 604, oxygen is restricted proximate to or within the one or more serrated elements when forming a gate oxide region underneath the tunneling region. As a result, a thinner gate oxide region is formed within the tunneling region. The forming of gate oxide can occur simultaneously within any of the one or more serrated elements, or at different times during the semiconductor process.

Accordingly, an exemplary method for providing a lower programming voltage in an EEPROM device can be provided with only minor changes to the drawing layer and without significant process modifications. Forming a thinner gate oxide region within the tunneling region results in a lower programming voltage needed by the EEPROM device. For example, an exemplary EEPROM device having a modified mask drawing layer can achieve a programming voltage of approximately 8.5 volts or lower, significantly less than the approximate 9.8 volts or more needed by conventional EEPROM devices. Lower programming voltage for the exemplary EEPROM device can thus allow for on-chip programming of precision analog circuits. Such a lower programming voltage can be suitably generated by any charge pump structure, or any other voltage supply or source, and with a low current requirement, e.g., a value of approximately 3 micro-amps or lower. Moreover, such a lower programming voltage capability with the exemplary EEPROM device, such as approximately 8.5 volts or lower, is suitably within the normal operating region of a lateral PNP device that can be configured for standard CMOS processes without requiring additional process changes.

The present invention has been described above with reference to various exemplary embodiments. However, various other changes and modifications may be made to the exemplary embodiments without departing from the scope of the present invention. For example, any one of the exemplary serrated elements can be configured in a similar manner to that of any other exemplary serrated elements, e.g., similar opening and narrowing region, and/or similar acute angles, or in a different manner from other exemplary serrated elements, e.g., one serrated element has an approximate 90 degree angle acute structure, with another serrated element having a rectangular structure, configured in opposing directions, or in similar directions. These and other changes or modifications are intended to be included within the scope of the present invention, as set forth in the following claims.

What is claimed is:

1. An EEPROM device having a lower programming voltage, said EEPROM device comprising:
   a programming capacitor configured within a polysilicon layer;
   a tunneling region configured within said polysilicon layer; and
   a drawing layer comprising at least one serrated element configured underneath said tunneling region, said at least one serrated element configured to provide a restriction of oxygen used to grow gate oxide for determining programming voltage of said EEPROM device.

2. The EEPROM device according to claim 1, wherein said at least one serrated element comprises a wider region reducing to a narrower region, said narrower region configured for restricting oxygen when drawing corners under polysilicon during a semiconductor manufacturing process resulting in a reduced growth of said gate oxide.

3. The EEPROM device according to claim 1, wherein said at least one serrated element comprises at least one acute angle structure configured within an active mask drawing layer, said at least one acute angle structure having an acute angle region configured for restriction of growth of said gate oxide.

4. The EEPROM device according to claim 3, wherein said acute angle region comprises an acute angle between greater than zero degrees and less than 180 degrees.

5. The EEPROM device according to claim 4, wherein said acute angle region comprises an acute angle between approximately 75 and 105 degrees.

6. The EEPROM device according to claim 1, wherein said at least one serrated element comprises at least one of a rectangular, pentagonal, hexagonal, and semi-circular region having an opened region and a more narrowed region configured for restriction of growth of said gate oxide.

7. The EEPROM device according to claim 1, wherein said EEPROM device comprises at least two serrated elements configured in a staggered arrangement to allow for misalignment between an active layer and a polysilicon layer.

8. The EEPROM device according to claim 1, wherein said EEPROM device comprises a double-bit configuration comprising a second programming capacitor and a second tunneling region, and at least one serrated element configured underneath said second tunneling region and configured to restrict oxygen used to grow gate oxide for determining programming voltage of said EEPROM device.

9. An analog integrated circuit comprising:
   an analog device configured for providing an output signal; and
   an EEPROM device configured for on-chip calibration of said analog device, said EEPROM device comprising:
      a programming capacitor configured within a polysilicon layer for providing a WRITE signal input;
      a tunneling region configured within said polysilicon layer for providing an ERASE signal input; and
      a drawing layer comprising at least one serrated element configured underneath said tunneling region to restrict growth of gate oxide, thus lowering a required programming voltage of said EEPROM device.

10. The analog integrated circuit according to claim 9, wherein said at least one serrated element comprises an wider region and a narrower region, said narrower region configured for restricting oxygen when drawing corners under a polysilicon layer during a semiconductor manufacturing process resulting in a reduced growth of said gate oxide.

11. The analog integrated circuit according to claim 9, wherein said at least one serrated element comprises at least one acute angle structure configured within an active mask drawing layer, said at least one acute angle structure having an acute angle region configured for restriction of growth of said gate oxide.

12. The analog integrated circuit according to claim 11, wherein said acute angle region comprises an acute angle between approximately 75 and 105 degrees.

13. The analog integrated circuit according to claim 9, wherein said at least one serrated element comprises at least one of a rectangular, pentagonal, hexagonal, and semi-circular region having an opened region and a more narrowed region configured for restriction of growth of said gate oxide.

14. The analog integrated circuit according to claim 9, wherein said EEPROM device comprises at least two serrated elements configured in a staggered arrangement to allow for misalignment between an active layer and a polysilicon layer.

15. The EEPROM device according to claim 9, wherein said EEPROM device comprises a double-bit configuration comprising a second programming capacitor and a second tunneling region, and at least one serrated element configured underneath said second tunneling region and configured to restrict oxygen used to grow gate oxide for determining programming voltage of said EEPROM device.

16. A method for providing a lower programming voltage in an EEPROM device, said method comprising the steps of:
   modifying a mask drawing layer with at least one serrated element configured underneath a tunneling region of the EEPROM device; and
   restricting oxygen proximate said at least one serrated element when forming a gate oxide region underneath said tunneling region resulting in a thinner gate oxide region being formed.

17. The method according to claim 16, wherein said step of modifying said mask drawing layer comprises providing a thin oxide region configured to restrict oxygen used for growing gate oxide.

18. The method according to claim 16, wherein said step of modifying said mask drawing layer comprises modifying an active mask drawing layer with at least one acute angle structure configured to provide said thinner gate oxide region.

19. The method according to claim 16, wherein said step of modifying said mask drawing layer comprises modifying an active mask drawing layer with a structure having an wider portion and a narrower portion configured to provide said thinner gate oxide region.

20. The method according to claim 16, wherein said step of modifying said mask drawing layer comprises staggering at least two serrated elements to allow for misalignment of an active layer and a polysilicon layer.

21. An EEPROM device requiring a lower programming voltage, said EEPROM device comprising:
   a programming capacitor;
   a tunneling region configured in a layer proximate to said programming capacitor; and
   at least one serrated element configured underneath said tunneling region, said at least one serrated element configured to restrict growth of gate oxide to reduce requirements for programming voltage of said EEPROM device.

22. The EEPROM device according to claim 21, wherein said at least one serrated element is configured to provide a restriction of oxygen used to grow said gate oxide.

23. The EEPROM device according to claim 22, wherein said at least one serrated element comprises a thinned region configured to provide said restriction in oxygen.

24. The EEPROM device according to claim 21, wherein said at least one serrated element comprises an opened region reducing to a narrowed region, said narrowed region configured for restricting oxygen when drawing corners under polysilicon during a semiconductor manufacturing process resulting in a reduced growth of said gate oxide.

25. The EEPROM device according to claim 21, wherein said at least one serrated element comprises at least one acute angle structure configured within an active mask drawing layer.

26. The EEPROM device according to claim 25, wherein said acute angle region comprises an acute angle between approximately 75 and 105 degrees.

27. The EEPROM device according to claim 21, wherein said EEPROM device comprises at least two serrated elements configured in a staggered arrangement to allow for misalignment between an active layer and a polysilicon layer.

28. The EEPROM device according to claim 21, wherein said EEPROM device comprises a distributed-gate configuration.

29. An analog integrated circuit comprising:
   an analog device configured for providing an output signal; and
   an EEPROM device configured calibration of said analog device, said EEPROM device comprising:
      a programming capacitor;
      a tunneling region configured in a layer proximate to said programming capacitor; and
      at least one serrated element configured underneath said tunneling region to restrict growth of gate oxide, thus lowering a required programming voltage of said EEPROM device.

30. The analog integrated circuit according to claim 29, wherein said at least one serrated element comprises an wider region and a narrower region, said narrower region configured for restricting oxygen when drawing corners under a polysilicon layer during a semiconductor manufacturing process resulting in a reduced growth of said gate oxide.

31. The analog integrated circuit according to claim 29, wherein said at least one serrated element is configured to enable said EEPROM device to utilize a programming voltage of less than approximately 8.8 volts.

32. The analog integrated circuit according to claim 29, wherein said at least one serrated element is configured to enable said EEPROM device to utilize a programming voltage generated by a charge pump using less than approximately 3 microamps.

33. An EEPROM device comprising:
   a tunneling region configured within a polysilicon layer; and
   at least one serrated element configured underneath said tunneling region, to provide a restriction of oxygen.

* * * * *